United States Patent
Lai et al.

(10) Patent No.: US 11,233,408 B2
(45) Date of Patent: Jan. 25, 2022

(54) SYSTEMS AND METHODS FOR MAINTAINING BATTERIES BASED ON USAGE

(71) Applicant: Gogoro Inc., Hong Kong (CN)

(72) Inventors: Yun-Chun Lai, Hsinchu (TW); Chien-Chung Chen, Taoyuan (TW); I-Fen Shih, New Taipei (TW)

(73) Assignee: Gogoro Inc., Hong Kong (CN)

( * ) Notice: Subject to any disclaimer, the term of this patent is extended or adjusted under 35 U.S.C. 154(b) by 76 days.

(21) Appl. No.: 16/236,171

(22) Filed: Dec. 28, 2018

(65) Prior Publication Data
US 2019/0207268 A1    Jul. 4, 2019

Related U.S. Application Data

(60) Provisional application No. 62/612,240, filed on Dec. 29, 2017.

(51) Int. Cl.
*H02J 7/00* (2006.01)
*B60L 53/80* (2019.01)
(Continued)

(52) U.S. Cl.
CPC .......... *H02J 7/0027* (2013.01); *B60L 53/68* (2019.02); *B60L 53/80* (2019.02);
(Continued)

(58) Field of Classification Search
CPC ...... H02J 7/0027; H02J 7/0069; H02J 7/0045; H02J 7/008; B60L 53/68; B60L 53/80;
(Continued)

(56) References Cited

U.S. PATENT DOCUMENTS 9,637,003 B2 *    5/2017    Leonard .................. B60L 58/21
2007/0018601 A1 *    1/2007    Steinbach ........... G06F 11/3447
                                                        318/568.11
(Continued)

FOREIGN PATENT DOCUMENTS

CN    102217120 A    10/2011
CN    206685499 U    11/2017
(Continued)

OTHER PUBLICATIONS

European Office Action issued for corresponding EP Application No. 18248283.6, Applicant: Gogoro Inc., dated Mar. 27, 2019, 4 pages.
(Continued)

*Primary Examiner* — Akm Zakaria
(74) *Attorney, Agent, or Firm* — Perkins Coie LLP

(57) ABSTRACT

The present disclosure relates to methods and associated systems for maintaining energy storage devices positioned in a device-exchange station. The method includes, for example, (1) periodically sending, by the device-exchange station, a request to a battery management system (BMS) associated with an energy storage device positioned in the device-exchange station; (2) receiving, by the device-exchange station, maintenance information from the BMS; and (3) in response to the maintenance information, determine whether to perform a maintenance action.

20 Claims, 10 Drawing Sheets

(51) Int. Cl.
  *B60L 53/68* (2019.01)
  *H01M 10/42* (2006.01)
  *H01M 10/48* (2006.01)
  *G01R 31/36* (2020.01)
  *G01R 31/3842* (2019.01)

(52) U.S. Cl.
  CPC ..... *G01R 31/3646* (2019.01); *G01R 31/3842* (2019.01); *H01M 10/425* (2013.01); *H01M 10/482* (2013.01); *H02J 7/008* (2013.01); *H02J 7/0013* (2013.01); *H02J 7/0045* (2013.01); *H02J 7/0069* (2020.01); *H02J 7/00712* (2020.01); *H01M 2010/4271* (2013.01)

(58) Field of Classification Search
  CPC ............. H01M 10/425; H01M 10/482; H01M 2010/4271; H01M 10/4207; H01M 10/441; G01R 31/3646; G01R 31/3842; H04L 67/10
  See application file for complete search history.

(56) References Cited

U.S. PATENT DOCUMENTS

| | | | |
|---|---|---|---|
| 2009/0198372 A1* | 8/2009 | Hammerslag | G07F 15/005 700/226 |
| 2013/0179061 A1* | 7/2013 | Gadh | B60L 53/63 701/123 |
| 2014/0088896 A1 | 3/2014 | Hu et al. | |
| 2016/0303990 A1* | 10/2016 | Penilla | H01M 2/1077 |
| 2016/0336623 A1 | 11/2016 | Nayar et al. | |

FOREIGN PATENT DOCUMENTS

| | | |
|---|---|---|
| JP | 2011132020 A | 7/2011 |
| JP | 2017502453 A | 1/2017 |
| KR | 101542665 B1 | 8/2015 |
| TW | 201605145 A | 2/2016 |

OTHER PUBLICATIONS

Indian Office Action received for corresponding Indian Application No. IN201814049435; Applicant: Gogoro Inc., dated Feb. 14, 2020, 6 pages.

Taiwanese Office Action received for corresponding Philippine Application No. TW107147258, Applicant: Gogoro Inc., dated Oct. 7, 2019, 18 pages.

Official Notification of Publication issued for corresponding Philippine Application No. PH1-2019-000009, Applicant: Gogoro Inc., dated Aug. 22, 2019, 3 pages.

English translation of Office Action received for Korean Application No. KR10-2018-0172296, Applicant: Gogoro Inc., dated May 22, 2020, 6 pages.

Office Action received for Korean Application No. KR10-2018-0172296, Applicant: Gogoro Inc., dated May 22, 2020, 6 pages.

China Office Action issued for copending CN Application No. CN201811628727.9, Applicant: Gogoro Inc., dated Mar. 5, 2021, 9 pages.

\* cited by examiner

SYSTEMS AND METHODS FOR MAINTAINING BATTERIES BASED ON USAGE

CROSS-REFERENCE TO RELATED APPLICATION

The present application claims the benefit of and priority to U.S. Provisional Application No. 62/612,240, filed Dec. 29, 2017, which is incorporated herein by reference in its entirety.

TECHNICAL FIELD

The present technology is directed to systems and methods for maintaining energy storage devices (e.g., batteries) in a device-exchange station based on its usage. More particularly, the present technology is directed to systems and methods for maintaining an energy storage device based on maintained information provided by a battery management system (BMS) associated with the energy storage device.

BACKGROUND

There are many factors affecting the characteristics or performance of a battery. For example, operating or charging conditions can affect the life span of a battery. Therefore, for systems that manage a large number of batteries, it is difficult to determine when to maintain or replace the batteries. It is even more difficult for systems that manage multiple types of batteries (e.g., batteries made by different manufacturers or with different specifications). Traditionally, a system operator can arbitrarily determine time for maintenance (e.g., two years from putting a battery in use). However, the traditional approach can be inaccurate and inefficient. Therefore, it is advantageous to have an improved system and method that can effectively manage or maintain multiple batteries.

BRIEF DESCRIPTION OF THE DRAWINGS

Embodiments of the disclosed technology will be described and explained through the use of the accompanying drawings.

Figure 1A:
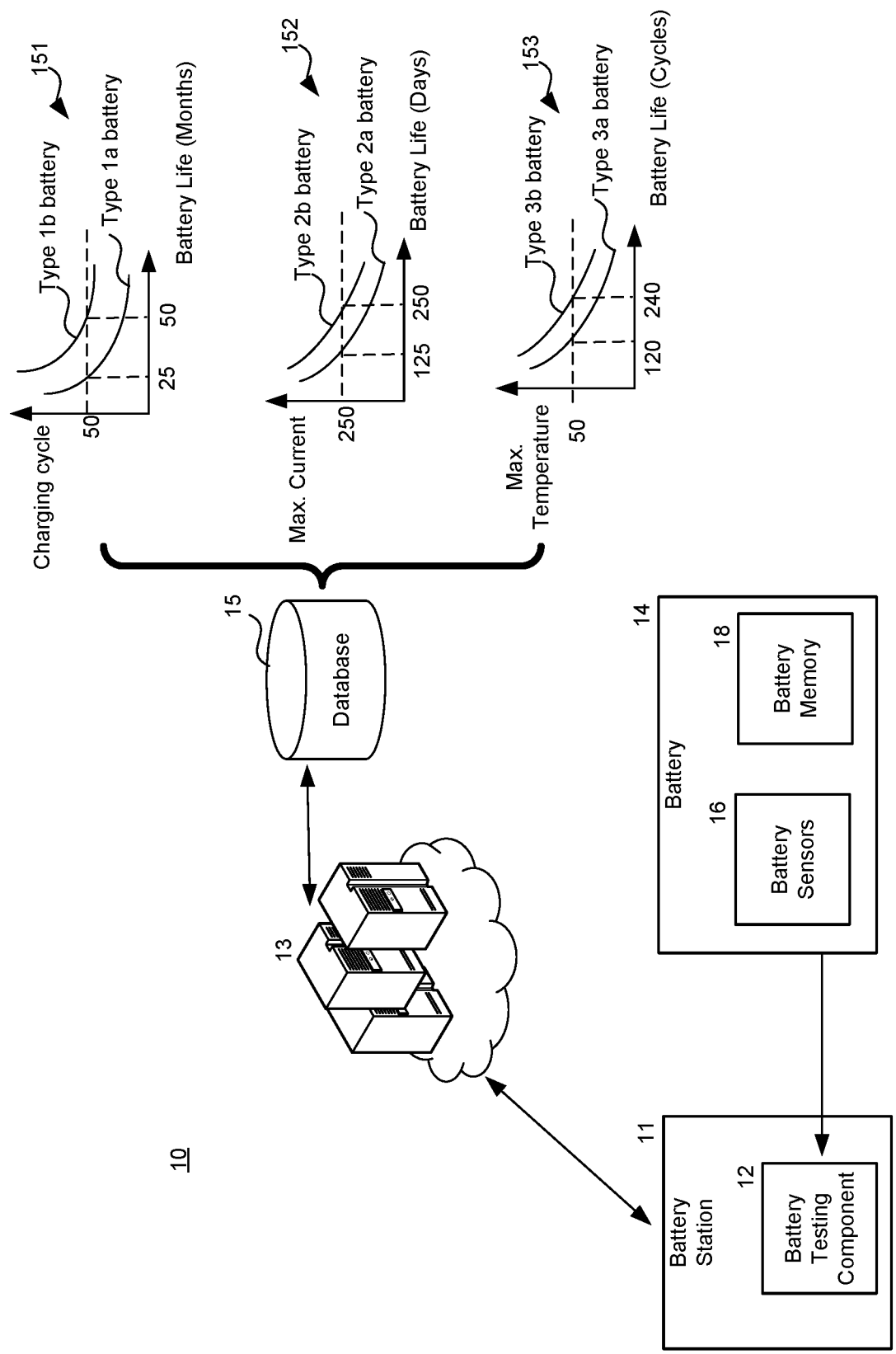
FIG. 1A is a schematic diagram illustrating a system in accordance with embodiments of the disclosed technology. The system is configured to detect the status of an inserted battery and analyze the same based on reference information stored in a database.

The drawings are not necessarily drawn to scale. For example, the dimensions of some of the elements in the figures may be expanded or reduced to help improve the understanding of various embodiments. Similarly, some components and/or operations may be separated into different blocks or combined into a single block for the purposes of discussion of some of the embodiments. Moreover, although specific embodiments have been shown by way of example in the drawings and described in detail below, one skilled in the art will recognize that modifications, equivalents, and alternatives will fall within the scope of the appended claims.

DETAILED DESCRIPTION

In this description, references to "some embodiments," "one embodiment," or the like, mean that the particular feature, function, structure or characteristic being described is included in at least one embodiment of the disclosed technology. Occurrences of such phrases in this specification do not necessarily all refer to the same embodiment. On the other hand, the embodiments referred to are not necessarily mutually exclusive.

The present technology is directed to systems and methods for maintaining energy storage devices (e.g., batteries) positioned in a device-exchange station (e.g., battery-exchange station) based on their actual usage. In some embodiments, the disclosed system (e.g., the device-exchange station) can determine when to replace or maintain a battery based on "maintenance information" provided by a battery management system (BMS) associated with one of the energy storage devices. The maintenance information is generated based on a test (e.g., a full charge capacity (FCC) calibration process, a charging/discharging test, etc.) performed by the BMS. In response to the maintenance information, the device-exchange station can perform a maintenance action such as (1) terminating a charging process of the energy storage device; (2) decreasing a "swapping priority" of the energy storage device; and/or (3) locking the energy storage device. By this configuration, the device-exchange station can effectively maintain the energy storage devices therein.

In some embodiments, the maintenance information can be stored in a battery memory attached to the battery. In some embodiments, the maintenance information can include a maintenance schedule (e.g., indicative of when to maintain the battery based on the tests performed by the BMS) stored in the battery memory such that when the disclosed system (e.g., a server, a battery-exchange station) can access the maintenance schedule to learn how and when to maintain or replace the battery.

In some embodiments, the disclosed system can also be implemented by a battery management system (BMS) embedded in a battery pack (e.g., the BMS can include multiple battery cells, a battery controller, a battery memory, a battery communication component, one or more battery sensors, etc.). The battery management system can monitor the status of the battery (e.g., battery internal resistance, battery's response to a specific charging current or charging voltage, other suitable battery characteristics, etc.) and determine whether (and when) the battery needs to be maintained (e.g., whether the battery's charge or discharge function perform properly). In some embodiments, the BMS can also communicate with other devices (e.g., a server or a station, via a battery management component 309 shown in FIG. 3) regarding the status of the battery.

In some embodiments, the battery management system can initiate a test for the battery to determine or verify the status of the battery. For example, when a battery is inserted in a battery-exchange station, the battery management system can request a charging/discharging test from the battery-exchange station. The result of the charging/discharging test can be used to determine whether there is an unexpected degradation of the battery (e.g., a decrease of the battery's capacity) or abnormal charging/discharging behavior. In some embodiments, the battery management system can initiate the test based on a predetermined maintenance schedule. In some embodiments, the test can be initiated in response to an error or abnormal signal/message detected by a battery sensor (e.g., positioned inside the battery). Once the system determines that there is any battery degradation, the system can accordingly adjust a charging or maintenance plan for the battery (e.g., recalibrate the battery's charge capacity or change the battery's maintenance schedule).

The present disclosure also relates to a method and system for maintaining or replacing multiple energy storage devices (e.g., batteries) of a battery-exchange system. The disclosed system maintains each of the energy storage devices based on a customized battery maintenance plan determined based on actual usage of each battery. The disclosed system first establishes a set of reference information based on multiple sampling batteries or information from other sources such as battery manufacturer's testing agencies of the like. For example, the disclosed system can retrieve or generate a characteristic curve representing how a battery's actual use can affect that battery's characteristics or performance. For example, by analyzing, the reference information, the disclosed system may determine that batteries of the same type (e.g., made by manufacturer M1, having hardware version V1, with battery cell C1, having a battery full charge capacity FCC1, having an expected life span of 1000 charging cycles, etc.) may perform differently after experiencing different operating conditions. Based on the differences, the disclosed system can the further divide the type of batteries into various sub-types based on usage parameters that affect their maintenance.

For example, the disclosed system can determine that if a type A1 battery has been charged over 40 degrees Celsius for more than 3 hours, the FCC of the battery decreases 1% per charging cycle. In this embodiment, the disclosed system can set this type of battery as a type "A1a" battery. As another example, the disclosed system can determine that if a type A1 battery has been depleted to a level lower than 2% of its FCC at a rate of twice per month or more, the expected life span of that battery decreases from 1000 charging cycles to 800 charging cycles. In this embodiment, the disclosed system can set this type of battery as a type "A1b" battery. In some embodiments, the disclosed system can analyze information collected from a battery (e.g., battery hardware/firmware version, battery cell type, battery state of charge SOC, battery full charge capacity FCC, battery state of health SOH (e.g., a percentage showing a battery's degradation; for example, a battery's SoH is 100% at the time of manufacture, and decreases over time and use; the SoH can be measured based on its internal resistance, capacity, voltage, ability to accept a charge, ability to discharge, charging cycles, etc.), battery age (time or cycle counts), battery error status, battery direct current internal resistance DCIR, etc.) versus one or more battery usage factors (e.g., recorded battery cell temperatures, battery circuit temperatures, charging patterns, discharging patterns, duration, other suitable working or operating conditions, environmental conditions, user driving/riding behavior, etc.).

Based on the analyses above, the disclosed system establishes the reference information that can be later used for determining a battery maintenance plan for an exchangeable battery. In some embodiments, when a user inserts an exchangeable battery in a battery-exchange station, the disclosed system receives stored battery characteristic information and battery usage information from a memory attached to the exchangeable battery. The disclosed system then compares the received battery information with the reference information and accordingly generates a customized battery maintenance plan.

For example, the disclosed system can determine that the inserted battery is a "Type A1b" battery. For a "Type A1" battery, the recommended maintenance time is some time before it reaches 1000 charging cycles. For a "Type A1b" battery, however, the recommended maintenance time can be some time before it reaches 700 charging cycles. In the illustrated embodiments, the disclosed system can determine that the inserted battery needs to be maintained when it reaches 700 charging cycles. In some embodiments, the battery maintenance plan can be adjusted based on one or more other factors such as, operation time (e.g., for how long a battery has been continuously discharged), charging/discharging time (e.g., for how long a battery continuously being charged/discharged), a deployment duration (e.g., time in a battery station or a vehicle), etc.

In some embodiments, a system operator or battery manufacturer of the battery cell/pack may find certain batch of battery packs or cells have some abnormal behavior during operation or experiment. The system may accordingly create a list of the batteries involving these battery cells/packs (e.g., based on certain manufacturing batch, based on serial numbers, etc.) and track the locations of the batteries. For example, the batteries can be in a battery-exchange station, be possessed by a user, or be used in a vehicle. The disclosed system can accordingly generate battery maintenance plans for these batteries, including "locking" these batteries (e.g., not charging and releasing them for any user) when they are inserted in a battery station. The disclosed system can also send a notification to a service crew to pick up these locked batteries for maintenance or replacement.

After determining the customized battery maintenance plan for the inserted battery, the disclosed system can implement that plan according to how the inserted battery was actually used. For example, the disclosed system can determine that the inserted battery is a "Type A1b" battery" and it has been through 698 charging cycles (in the example discussed above, the battery needs to be maintained or replaced before reaching 700 charging cycles).

In some embodiments, the system (e.g., a server or a battery-exchange station) may lock the inserted batteries that are on the list, and the system can execute corresponding battery maintenance plans. For example, a battery maintenance plan can be executed by a BMS embedded in the inserted battery. The BMS embedded in the inserted battery can send a message to a battery-exchange station, in which the inserted battery is positioned. In some embodiments, the inserted battery can accordingly be "locked" in the battery-exchange station (e.g., not to be released to a user). In some embodiments, the battery-exchange station or the BMS can execute a battery maintenance plan for the inserted battery (e.g., perform a FCC calibration process for the inserted battery to adjust its FCC or capacity). In some embodiments, the inserted battery can send a message (e.g., including a warning or an error message to the battery-exchange station) to the batter exchange station when the BMS detects any abnormal behavior. Once the battery-exchange station receives the warning or error message, the battery-exchange station can "lock" the battery, perform a test or FCC calibration for the inserted battery, and/or notify a server for further process.

In some embodiments, the system (e.g., the server or the battery-exchange station) may instruct a service/courier crew to collect the inserted battery. In some embodiments, the system (e.g., the server or the battery-exchange station) can still charge the inserted battery but lower its swapping priority (compared to other normal batteries). In other words, the system will provide normal batteries to a user before providing the "locked" battery. This could be helpful to meet a high battery demand of a station during high-demand time intervals.

In some embodiments, the disclosed system can implement the maintenance plan by sending a user coming to the battery-exchange station a notice, asking the user to help move the inserted battery to a maintenance facility or another battery-exchange station (e.g., the disclosed system can provide certain incentives, credits, points, etc. to motivate the user). In other embodiments, the disclosed system can notify a system service/courier crew to pick up the inserted battery. In some embodiments, the disclosed system can consider a user's historical route data and accordingly provide the inserted battery to the user (e.g., perhaps at a discounted rate) to let the inserted battery be transported/delivered by the user to a designation station (e.g., a station near a battery factory or a customer service center), where the inserted battery can be picked up by a service crew for further action.

In some embodiments, the disclosed system determines that the inserted battery is a "Type A1a" battery" and has been through 900 charging cycles. The disclosed system also determines that the current FCC of the inserted battery is 91%. As discussed in the previous example, a "Type A1a" battery's FCC decreases 1% per charging cycle. The threshold FCC value for a "Type A1a" battery can be 88%. Therefore, the inserted battery needs to be maintained when its FCC reaches the threshold FCC value. Based on the determination, the disclosed system then generates a customized battery maintenance plan (e.g., after detecting the inserted battery's FCC value) and implements accordingly (e.g., motivating a user to deliver the battery to a maintenance facility or instructing a service crew to pick it up, etc.).

In some embodiments, the disclosed system determines not to take an action for maintaining the inserted battery at this stage. For example, based on the usage analysis mentioned above, the disclosed system determines that the inserted battery is still in good condition to be charged and to be exchanged by a user. In such embodiments, the disclosed system can store the usage analysis result in a memory attached to the inserted battery (or upload it to a server) for future reference. In some embodiments, the disclosed system can have a maintenance policy which has a threshold time period for determining whether to take an action. For example, the threshold time period can be 30 days. In an event that a time difference between an expected battery maintenance time (e.g., 20 days later) and the time at which an exchangeable battery is inserted in a battery station is greater than 30 days, the disclosed system can determine not to take an action at this stage. When the time difference is less than 30 days, the disclosed system can determine to implement the generated battery maintenance plan (e.g., motivating a user to deliver the battery to a maintenance facility or instructing a service crew to pick it up, etc.)

As another example, the disclosed system uses a threshold charging cycle count (e.g., how many remaining charging cycles until next maintenance) to determine whether to take an action. For example, the threshold cycle count can be 10 cycles. In an event that a cycle count difference between an expected battery maintenance cycle count (e.g., 1000 cycles) and the current charging cycle count of an inserted exchangeable battery (e.g., 950 cycles) is greater than 10 cycles, the disclosed system can determine not to take an action at this stage. When the cycle count difference is fewer than 10 cycles (e.g., the current charging cycle count is 998), the disclosed system can determine to implement the generated battery maintenance plan.

In some embodiments, the disclosed system sends a notice to a user when the user removes a battery from a battery-exchange station. For example, when the disclosed system determines that the battery removed by a user needs to be maintained shortly (e.g., according to a customized battery maintenance plan), the disclosed system sends a message to a mobile device of the user, stating that if the user returns the removed battery (after his/her use of the battery) to a particular location (e.g., a battery station, a maintenance facility, a courier post, etc.), the user will receive certain rewards (e.g., discounts for future battery-exchange, credits, cash rebates, points, etc.). In some embodiments, the notice can be visually presented by a display of the battery-exchange station.

Another aspect of the disclosed technology is that it provides a "dynamic" monitoring and analysis for an exchangeable battery. Because the battery characteristics are "dynamic" (e.g., can change over time after being utilized/operated differently), the disclosed system closely monitors the current status of a battery, and generates/implements a customized maintenance plan. For example, the disclosed system can analyze the usage history of a battery when it is inserted to a battery-exchange station (or is connected to a server, in some embodiments). By this arrangement, the disclosed system is capable of closely monitoring the current status of the inserted battery and generating a customized maintenance plan.

In some embodiments, the disclosed method can be implemented by a battery-exchange station. In some embodiments, the disclosed method can be implemented by a server that manages multiple battery-exchange stations. In some embodiments, the disclosed method can be implemented by both a battery-exchange station and a server that manages multiple battery-exchange stations.

In some embodiments, a system is configured to (1) collect and analyze battery information from multiple sampling batteries (e.g., in some embodiments, the sampling batteries can be multiple batteries managed or controlled by the disclosed system) and (2) generate reference information accordingly (e.g., the reference information can be analyzed or updated periodically such as daily or weekly, or can be updated in response to a triggering event such as, a new battery station joining the system, a new user subscribing a battery plan, etc.). The present system can first collect the measured battery information from multiple sampling batteries. In some embodiments, the sampling batteries can include rechargeable/exchangeable batteries that are currently deployed in a battery-exchange marketplace. For example, the sampling batteries can include batteries that have been used by a user (e.g., a battery plan subscriber) to power the user's electric vehicle. In some embodiments, the sampling batteries can include batteries not yet in use (e.g., those that are tested or stored in factories, warehouses, laboratories, etc.). In some embodiments, the disclosed system collects information from multiple sources (e.g., battery-exchange stations, electric vehicles, batteries, user mobile devices, etc.). In some embodiments, the disclosed system collects information from a database. The disclosed system then analyzes the collected battery information and accordingly generates a set of reference information. For example, the present system can categorize the collected battery information based on multiple factors such as, (1) battery manufacturing information, (2) battery basic characteristics, and (3) battery usage. Examples of the factors are discussed below.

Examples of the battery manufacturing information can include the identity of the battery manufacturer (e.g., batteries made by different manufacturers may have different characteristics, although their battery specifications may be the same), manufacturing dates (e.g., batteries made on different dates may have different characteristics), manufacturing batches (e.g., batteries made in different batches may still have different characteristics), battery hardware/firmware versions, and/or manufacturing serial numbers (e.g., individual batteries can have different characteristics).

Examples of the battery basic characteristics include a battery capacity (e.g., full charge capacity, FCC), a battery discharging capacity (e.g., how much power can a battery provide under certain conditions), battery cell types, battery direct current internal resistance (DCIR), and/or a suggested battery working temperature (e.g., a temperature range such as 5 to 35 degrees Celsius, including a battery cell temperature and a battery circuit temperature). Other examples of the battery basic characteristics can include a suggested battery charging temperature (e.g., a temperature range such as 25 to 40 degrees Celsius), a suggested battery charging current (e.g., a constant or regulated current), a suggested battery charging voltage (e.g., a constant or regulated voltage), a suggested battery charging cycle (e.g., at least one full charging per week), a suggested battery charging speed (e.g., increasing 10% state of charge, SoC, of a battery in 5 minutes), a suggested full charge point (e.g., 98% of its FCC), and/or a suggested battery charging time (e.g., not to be continuously charged for more than 5 hours).

Examples of battery usage factors include an actual battery charging temperature history (e.g., a battery was charged yesterday at 30 degrees Celsius and at 35 degrees Celsius earlier today for 25 minutes), an actual battery charging current (e.g., 1-50 Amperes), an actual battery charging voltage (e.g., 1-220 volts), a number of actual battery charging cycles (e.g., a battery has been through 50 full charge cycles and 125 partial cycles), an actual battery charging speed or charging rate (e.g., 20 Amperes for a half hour and 30 Amperes for another half hour, etc.), an actual battery charging time (e.g., a battery was charged for 56 minutes yesterday), an actual battery working temperature (e.g., a battery was operating at 35 degrees Celsius yesterday for 2 hours), and an actual battery discharging time (e.g., a battery was discharged at its full current capacity for 15 minutes yesterday).

Through analyzing the collected battery information versus one or more of the factors mentioned above, the present system establishes a set of reference information that enables the system to understand how to maintain a particular type of rechargeable battery to achieve an object or goal. For example, based on the analysis, the present technology can generate a customized battery maintenance plan that can maintain the maximum capacity of a particular type of battery as long as possible. As another example, the present technology can generate a customized battery maintenance plan that can maximize the life span of a type of battery. In some embodiments, the present technology can generate a customized battery maintenance plan that enables a specific type of battery to have a maximum number of charging cycles (e.g., after 500 charging cycles, the battery can still have a 90% capacity of its original capacity). In other embodiments, the present technology can have other types of suitable objects (e.g., to maximize customer satisfaction, to have the best battery performance, to enhance user experience, etc.).

Various embodiments of the present technology may provide one or more of the following technological improvements: (1) the ability to dynamically monitor the status of multiple exchange batteries and to generate customized battery maintenance plans ready for a battery-exchange station to follow; (2) the ability to effectively maximize battery life spans and performance by implementing the customized battery maintenance plans; (3) the ability to enable an operator to manage batteries in multiple battery-exchange stations; and (4) the ability to provide enhanced user experiences by offering satisfying battery experience in an energy-efficient fashion.

In some embodiments, if the disclosed system determines that a battery needs to be maintained or replaced (e.g., the battery's full charge capacity, FCC, is lower than a threshold value), the disclosed system can send a notice (e.g., a warning, a message, a calibration notification, etc.) to a system operator such that the system operator can plan maintenance or replacement for that battery accordingly.

In the following description, for the purposes of explanation, numerous specific details are set forth in order to provide a thorough understanding of embodiments of the present technology. It will be apparent, however, that embodiments of the present technology may be practiced without some of these specific details.

FIG. 1A is a schematic diagram illustrating a system 10 in accordance with embodiments of the disclosed technology. The system 10 includes a battery station 11, a server 13 connected with the battery station 11, and a database 15 connected with the server 13. The battery station 11 is configured to determine the type of a battery 14 and to charge and/or maintain the same. In some embodiments, the battery station 11 includes a battery testing component 12. The battery 14 includes one or more battery sensors 16 and a battery memory 18. The battery sensors 16 are configured to measure/sense a status (e.g., temperature, current, voltage, etc.) of the battery 14. The battery memory 18 is configured to store information associated with the battery 14 (e.g., usage information such as how many charge cycles the battery 14 has been experienced, measured temperature during charging or during use, how the battery 14 was operated such as state of discharge, etc.).

In some embodiments, the battery testing component 12 can be a load that can be used to test the battery 14. For example, when the battery 14 is electrically coupled to the battery station 11, the load can consume a small amount of energy of the battery 14 so as to learn how well the battery 14 can respond to the load. In such embodiments, once the battery 14 is inserted to a battery slot of the battery station 11, the battery testing component 12 can test and learn the characteristics of the battery 14. The battery station 11 can then upload the testing result to the server 13. The server 13 analyzes the testing result along with other information received from the battery 14 and with reference information stored in the database 15 to determine if any change should be made to the maintenance plan for this particular battery. The system 10 accordingly generates a battery maintenance plan based on the number of factors considered.

In FIG. 1A, several embodiments of the reference information are shown in form of characteristic curves/lines only for example. In other embodiments, however, the reference information can include other types of suitable information associated with battery maintenance or replacement (e.g., relationships between battery life verses other battery factors such as (1) battery manufacturing information, (2) battery basic characteristics, and (3) battery usage, as discussed above) in other suitable forms.

For example, the reference information stored in the database 15 includes how a number of different factors affect the life of particular types of batteries. As shown in FIG. 1A, the reference information includes relationships between a battery charging cycle and a battery life (e.g., chart 151 in FIG. 1A). For example, after experiencing 50 charging cycles, a Type 1a battery has a 25-month remaining life whereas a Type 1b battery has a 50-month remaining life. The reference information can include relationships between a maximum charging current and a battery life (e.g., chart 152 in FIG. 1A). For example, after experiencing a 50 Ampere charging-current for one hour, a Type 2a battery has a 125-day remaining life whereas a Type 2b battery has a 250-day remaining life. The reference information can include relationships between a battery charging cycle and a maximum operating temperature (e.g., chart 153 in FIG. 1A). For example, after being operated at 50-degree-Celsius for one hour, a Type 3a battery has a 120 remaining charging cycles whereas a Type 3b battery has a 240 remaining charging cycles. In some embodiments, the maintenance plan for a particular battery is determined or modified based on the information stored in the database 15 and from information read from the battery memory 18. For example, a battery may have an expected life of 500 charging cycles. However, if the battery has ever experienced a temperature above 50 degrees Celsius, then the expected life may be reduced. The server 13 can detect this high-temperature usage and therefore consider all the factors in the database 15 and information received from the battery to calculate a maintenance plan for the particular battery.

Based on the reference information, the system 10 determines a suitable maintenance plan for the battery 14. For example, when the battery 14 is determined as a Type 2a battery and the battery 14 has been charged at 50 Amperes for one hour, the system 10 can predict that the remaining battery life of the battery 14 is around 125 days. Then the system 10 can schedule a maintenance/replacement date for the battery 14 accordingly (e.g., to be maintained in 100 days). In some embodiments, the maintenance plan for the battery 14 can include how to charge the battery 14 so as to maximize its battery life or performance.

Figure 1B:
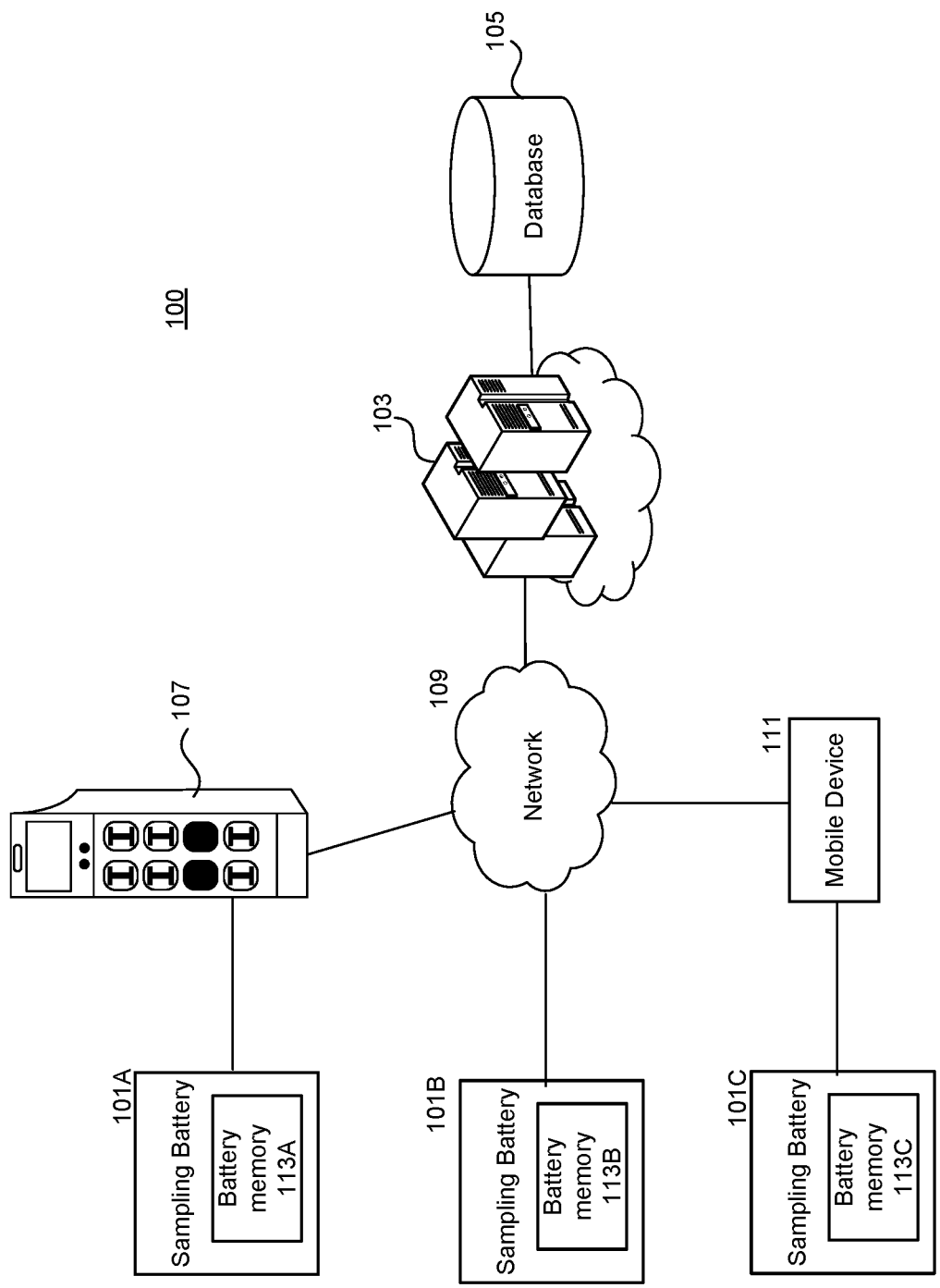
FIG. 1B is a schematic diagram illustrating a system in accordance with embodiments of the disclosed technology. The system is configured to collect information from multiple sampling batteries.

In some embodiments, the reference information can be created based on analyzing data collected from various sampling batteries. FIG. 1B is a schematic diagram illustrating a system 100 in accordance with embodiments of the disclosed technology. The system 100 is configured to collect battery information from multiple sampling batteries 101 (shown as 101A-C in FIG. 1B). The system 100 includes a server 103, a database 105 coupled to the server 103, and a battery-exchange station 107. As shown, the battery-exchange station 107 can communicate with the server 103 via a network 109. Each of the sampling batteries 101 includes a battery memory 113 (shown as 113A-C in FIG. 1B). The battery memory 113 is configured to store and record battery information associated with the corresponding sampling battery 101. In some embodiments, the battery memory 113 can be coupled to a controller (e.g., a control chip, a processor, a circuit, etc., not shown in FIG. 1B) attached to the sampling battery 101. The controller can manage the battery information stored in the battery memory 113.

As shown in FIG. 1B, the server 103 is configured to collect battery information from the battery memory 113A through the battery-exchange station 107 via the network 109. In some embodiments, the server 103 can directly receive battery information from the battery memory 113B via the network 109. The server 103 can also receive battery information from the battery memory 113C through a mobile device 111 (e.g., a battery user's smartphone that has an app configured to manage the sampling battery 101C) via the network 109. After collecting the battery information, the server 103 can analyze the collected battery information to determine or identify battery characteristics or patterns that can be used as reference information to generate customized battery maintenance plans. Embodiments of the server 103 are discussed in detail below with reference to FIG. 4.

The database 105 can store information associated with the present disclosure (e.g., information collected by the server 103, information analyzed by the server 103, information generated by the server 103, reference information, user account information, user battery plans, user histories, user behavior, user driving/riding habits, environmental conditions, event information, etc.). In some embodiments, the database 105 also stores information from a publicly accessible database (e.g., weather forecast database, travel alert database, traffic information database, location service database, map database, etc.) maintained by government or private entities. In some embodiments, the database 105 can also store proprietary information (e.g., user account, user credit history, user subscription information, etc.).

The network 109 can be a local area network (LAN) or a wide area network (WAN), but it can also be other wired or wireless networks. The network 109 can be the Internet or some other public or private network. The battery-exchange station 107 or the mobile device 111 can be connected to the network 109 through a network interface (e.g., by a wired or wireless communication). The server 103 can be coupled to the database 105 via any kind of local, wide area, wired, or wireless network, including the network 109 or a separate public or private network. In some embodiments, the network 109 includes a secured network that is used by a private entity (e.g., a company, etc.).

In some embodiments, the battery-exchange station 107 can be configured to collect battery information from the sampling batteries 101 and perform the analysis discussed above. In such embodiments, the battery-exchange station 107 can analyze the collected battery information to determine or identify battery characteristics or patterns that can be used as reference information for generating customized battery maintenance plans. Such reference information can be stored locally (e.g., in the battery-exchange station 107) or can be transmitted or uploaded to the server 103. Embodiments of the battery-exchange station 107 are discussed in detail below with reference to FIGS. 2A and 3.

Figure 1C:
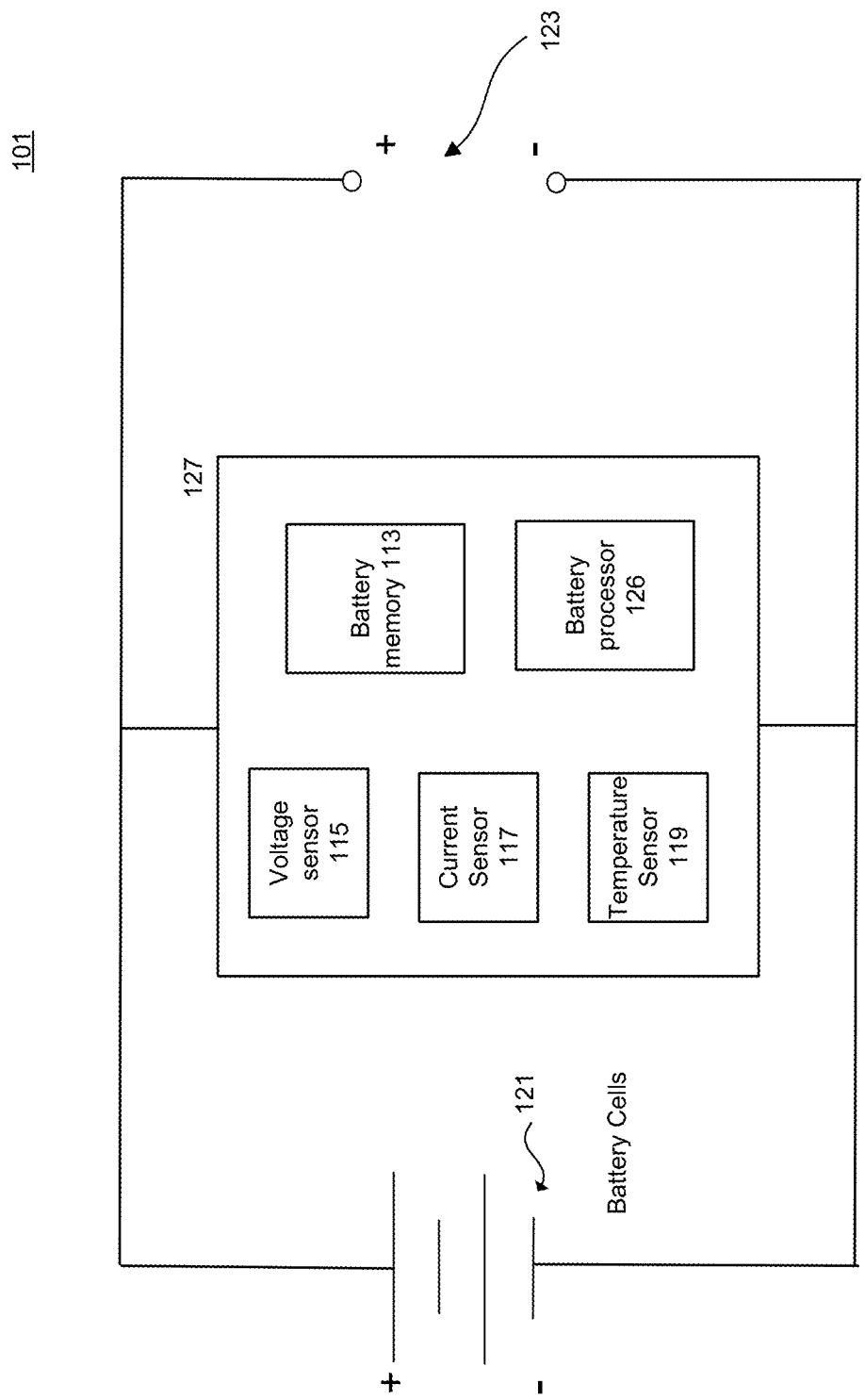
FIG. 1C is a schematic diagram illustrating a battery in accordance with embodiments of the disclosed technology.

FIG. 1C is a schematic diagram illustrating the battery 101 in accordance with embodiments of the disclosed technology. As shown, the battery 101 includes one or more battery cells 121, a battery management system (BMS) 127, and connectors 123 configured to couple to an external device (e.g., an electric motor). In the illustrated embodiments, the battery management system battery 127 includes a battery memory 113, one or more sensors such as a voltage sensor 115, a current sensor 117, a temperature sensor 119, and a battery processor 126. The battery processor is configured to monitor a status of the battery 101 and to communicate with a battery-exchange station (e.g., battery-exchange station 207) or a server (e.g., server 13 or 103). The battery cells 121 stores electric energy therein. The voltage sensor 115 is configured to measure a charging voltage of the battery 101. The current sensor 117 is configured to measure a charging and/or discharging current of the battery 101. The temperature sensor 119 is configured to measure a charging or usage temperature (e.g., a battery cell temperature and/or a battery circuit temperature) of the battery 101. The measured information is stored in the battery memory 113 and can be accessible via a wired or wireless connection by a mobile device, a battery-exchange station, a vehicle, and/or a server.

Figure 2A:
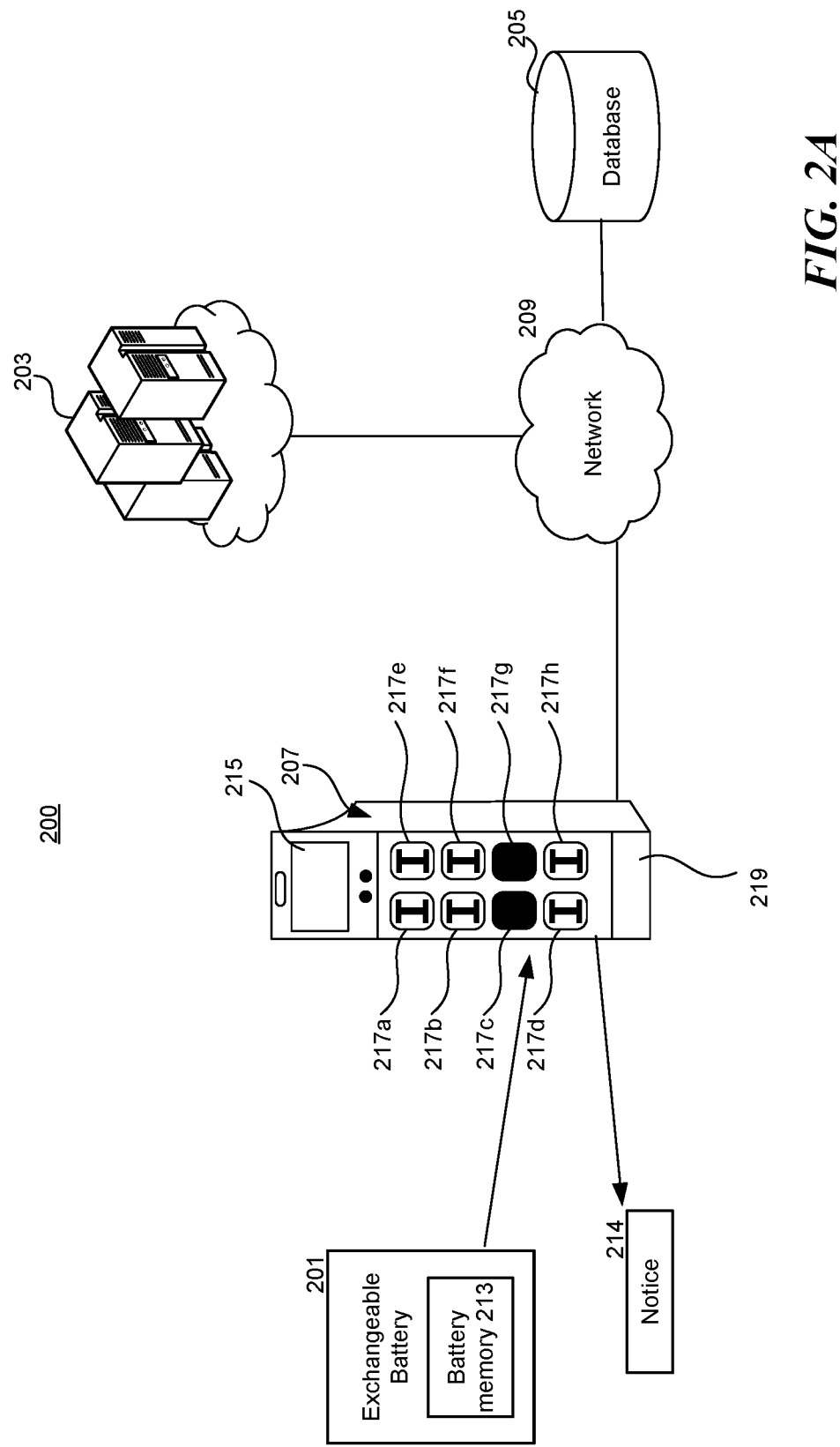
FIG. 2A is a schematic diagram illustrating a system in accordance with embodiments of the disclosed technology. The system is configured to determine a battery maintenance plan for an exchangeable battery.

FIG. 2A is a schematic diagram illustrating a system 200 in accordance with embodiments of the disclosed technology. The system 200 is configured to (1) determine a battery maintenance plan for an inserted exchangeable battery 201; (2) maintaining batteries based on maintenance information by performing maintenance action. The system 200 includes a server 203, a database 205, and a battery-exchange station 207. The server 203, database 205, and the battery-exchange station 207 can communicate with one another via a network 209. As shown, the battery-exchange station 207 includes (i) a display 215 configured to interact with a user, and (ii) a battery rack 219 having eight battery slots 217*a-h* configured to accommodate batteries to be charged.

During operation, there are only six battery slots (e.g., slots 217*a*, 217*b*, 217*d*, 217*e*, 217*f*, and 217*h*) occupied by batteries, and the remaining two slots (e.g., slots 217*c* and 217*g*) are reserved for a user to insert a battery to be exchanged (e.g., low power or depleted batteries). In some embodiments, the battery-exchange station 207 can have different arrangements such as different numbers of racks, displays, and/or slots. In some embodiments, the battery-exchange station 207 can include modular components (e.g., modular racks, modular displays, etc.) that enable an operator to conveniently install or expand the capacity of the battery-exchange station 207. The battery-exchange station 207 can be electrically coupled to one or more power sources (e.g., power grid, power lines, power storage, power station/substations, etc.) to receive power to charge the batteries positioned therein and to perform other operations (e.g., to communicate with the server 203). In some embodiments, a user can remove a battery from the battery-exchange station 207, without inserting one beforehand. In some embodiments, the battery-exchange station 207 can have a locking mechanism (e.g., a gate for one of the slots 217*a-h*, a mechanical lock, etc.) for securing the batteries positioned therein. In some embodiments, the battery-exchange station 207 can be implemented without the locking mechanism.

Each of the batteries in the system 200 can have a memory (e.g., battery memory 113) and a battery management system (BMS) configured to record battery information regarding battery characteristics, usage, maintenance/repair/replace schedules, etc. Such battery information can be stored in the memory and upload to the server 203.

The BMS is configured to monitor the status of the battery. For example, the BMS can periodically perform a test on the batteries. Examples of the test includes, a full charge capacity (FCC) calibration process (e.g., to monitor a change of the battery's FCC with time), a charging test (e.g., to test if the battery can be charged properly; the BMS can initiate this test and the battery-exchange station 207 can perform upon BMS' request), a discharging test (e.g., to test if the battery can discharge properly; the BMS can initiate this test and the battery-exchange station 207 can perform upon BMS' request), etc. The BMS will store the result of these tests (e.g., the "maintenance information") and provide the same to the battery-exchange station 207 periodically or upon request.

In some embodiments, the battery-exchange station 207 can periodically send a request (or a query) to the BMS for the "maintenance information" of the battery. For example, the battery-exchange station 207 can send the request daily, weekly, or biweekly. In some embodiments, the battery-exchange station 207 can send the request upon a system operator's request. Upon receiving the request, the BMS then provide the maintenance information to the battery-exchange station 207. In response to the maintenance information (if there is an abnormal message justifying a further action), the battery-exchange station 207 can determine whether to perform a "maintenance action" such as (1) terminating a charging process of the battery (when a battery is abnormal, the battery-exchange station 207 stops charging that battery to avoid further damages to the battery); (2) decreasing a swapping priority of the battery; and/or (3) locking the battery.

In some embodiments, the battery-exchange station 207 can manage batteries positioned in the battery slots 217*a*, 217*b*, 217*d*, 217*e*, 217*f*, and 217*h* based swapping priorities. To determine which batteries is to be provided to a user, the battery-exchange station 207 can assign a "swapping priority" to each of the batteries therein. In some embodiments, the swapping priority is a value that is indicative of an order that a station follows to provide the batteries positioned therein. The swapping priority can be determined based on one or more characteristics of a battery, such as a state of charge SoC, a charging rule/profile, an expected (e.g., from a user reservation) or a predicted (e.g., calculated based on historical demands) battery demand, life expectancy, charging cycles, recorded cell temperatures, a battery type, or other suitable characteristics. For example, a new battery can have a swapping priority higher than it of an old battery. The new battery usually has fewer charging cycles or a manufacturing date close to present. The new battery generally provides a user with better battery experience. For example, the new battery can be more reliable or have desirable performance or suitable operating condition (such as the battery cell temperature is not too high when in operation).

Assume that these batteries are batteries B1-B6 with swapping priorities, "1," "2," "3," "4," "5," and "6," which can be initially determined based on the battery's state of charge (SoC). Battery B6 has the highest swapping priority and therefore is expected to be picked up next. Assume that the battery-exchange station 207 receives an abnormal message for battery B5, then battery-exchange station 207 can decrease its swapping priority. As a result, the adjusted swapping priorities for batteries B1-B6 are now "2," "3," "4," "5," "1," and "6." By decreasing the swapping priority of battery B5, the battery-exchange station 207 can keep that battery in station (e.g., unless there is a demand requiring battery B5 to be exchanged) and wait for a service crew to pick it up.

In some embodiments, the battery-exchange station 207 can "lock" (e.g., make it not exchangeable) the battery that has an abnormal message, disregarding a battery demand. For example, the battery-exchange station 207 can simply remove that battery from an available battery list. In some embodiments, the battery-exchange station 207 can use a locking mechanism (e.g., a gate/door for a slot configured to position the energy storage device, a mechanical lock, etc.) to physically lock the battery.

In some embodiments, the "maintenance information" can include the result of a FCC calibration process performed by the BMS. In some embodiments, the battery-exchange station 207 can categorize the batteries based on the results and accordingly generate a message (to the server 203 or to a service crew or a user) to take certain actions. For example, the system 200 (e.g., the battery-exchange station 207 or the server 203) can have three categories, "Normal," "Watch list," and "To be locked," based on the changes of the batteries' FCCs in the past a few charging cycles. For example, the system 200 can consider (1) the FCC change of a battery in the last three charging cycles as a short-term trend; and (2) the FCC change of the battery in the last ten charging cycles as a long-term trend.

For example, the "Normal" category can refer to batteries that have a short-term trend of FCC change less than 2% (of its original FCC) (the "short-term lower threshold") and a long-term trend of FCC change less than 1% (of its original FCC) (the "long-term lower threshold"). The "Watch list" category can refer to batteries that have a short-term trend of FCC change in range of about 2-10% (of its original FCC) (the "short-term FCC range") or a long-term trend of FCC change in range of about 1-5% (of its original FCC) (the "long-term FCC range"). The "To be locked" category can refer to batteries that have a short-term trend of FCC change more than 10% (of its original FCC) (the "short-term upper threshold") or a long-term trend of FCC change more than 5% (of its original FCC) (the "long-term upper threshold").

Assume that battery A has a short-term trend of 0.5% (e.g., the last two recorded FCCs are 99.6% and 99.4%; the average of recorded FCC changes 0.6% and 0.4% is therefore 0.5%) and a long-term trend of 0.4% (e.g., the last ten recorded FCCs are 99.6%, 99.4%, 99.4%, 99.4%, 99.4%, 99.6%, 99.4%, 99.7%, 99.7%, and 99.8%; the average of the recorded FCC changes 0.4%, 0.6%, 0.6%, 0.6%, 0.6%, 0.4%, 0.6%. 0.3%, 0.3%, and 0.2% is therefore 0.4%). In that case, battery A can be categorized in the "Normal" category, and the system 200 will not take any action (e.g., sending a message) for battery A.

In another example, battery B has a short-term trend of 4% (e.g., the last two recorded FCCs are 95% and 97%; the average of recorded FCC changes 5% and 3% is therefore 4%) and a long-term trend of 3% (e.g., the last ten recorded FCCs are 95%, 97%, 97%, 96%, 98%, 97%, 97%, 98%, 97%, and 98%; the average of the recorded FCC changes 5%, 3%, 3%, 4%, 2%, 3%, 3%. 2%, 3%, and 2% is therefore 3%). In that case, because battery B's short-term trend (4%) is in the range of 2-10%, and its long-term trend (3%) is in the range of 1-5%, battery B is put in the "Watch list" category. Note that either the short-term trend or the long-term trend falls in the range defined above can result in putting battery B in the "Watch list" category. The system 200 can generate a message (e.g., a warning, an alert, a notice, etc.) and transmit the same to a device (e.g., a service crew's computer, a smartphone of a user, etc.).

In yet another example, battery C has a short-term trend of 11% (e.g., the last two recorded FCCs are 88% and 90%; the average of recorded FCC changes 12% and 10% is therefore 11%) and a long-term trend of 4% (e.g., the last ten recorded FCCs are 88%, 90%, 97%, 98%, 98%, 97%, 97%, 98%, 98%, and 99%; the average of the recorded FCC changes 12%, 10%, 3%, 2%, 2%, 3%, 3%. 2%, 2%, and 1% is therefore 4%). In that case, although battery C's long-term trend (4%) is still in the range of 1-5%, its short-term trend (11%) is greater than the 10% short-term threshold, therefore battery C is put in the "To be locked" category. In this case, the system 200 can generate a message (e.g., a warning, an alert, a notice, etc.) and transmit the same to the server 203 or a device (e.g., a service crew's computer, a smartphone of a user, etc.). The battery-exchange station 207 can accordingly "lock" battery C (e.g., make it "not exchangeable"). A service crew can plan to maintain, repair, or replace battery C.

As discussed above with reference to FIG. 1B, a set of reference information is generated based on battery information collected from the multiple sampling batteries 101. In some embodiments, the reference information is stored in the database 205 or the server 203. A user inserts the exchangeable battery 201 (which includes a battery memory 213 configured to store various types of battery information discussed above) into an empty battery slot (e.g., slot 217c, as shown in FIG. 2A) of the battery-exchange station 207. The battery-exchange station 207 collects the battery information (and transmits the same to the server 203, in some embodiments). In some embodiments, the station 207 analyzes the collected battery information and identifies the characteristics of the inserted battery 201. In some embodiments, the server 203 analyzes the collected battery information and identifies the characteristics of the inserted battery 201. The station 207 (or the server 203) compares the identified characteristics with the stored reference information. Based on the comparison, the station 207 (or server 203) can identify a second exchangeable battery 211 based on battery similarities. For example, the system 200 can identify the second battery 211 based on one or more battery characteristics such as battery manufacture, hardware/firmware versions, SoC, FCC, usage, expected/actual charging temperatures, etc.

The system 200 then generates a suitable battery maintenance plan for both the first battery 201 and the second battery 211. The battery maintenance plan includes maintaining or replacing the inserted battery 201 in particular ways (e.g., to be maintained after a period of time, a few charging cycles, etc.) The battery maintenance plan is determined based on battery characteristics of the inserted battery 201. The system 200 is configured to implement the battery maintenance plan.

In some embodiments, the system 200 can identify one or more characteristics of the inserted battery 201 and identify a match (or a general match) from the reference information (e.g., the reference information described in FIG. 1A) to determine a type of the inserted battery 201. In some embodiments, the system 200 determines the type of the inserted battery 201 from the information stored in the battery memory 213. After determining the type of the inserted battery 201, the system 200 can accordingly determine a battery maintenance plan for the inserted battery 201.

The system 200 can implement the determined battery maintenance plan by not taking any immediate action. For example, if the system 200 determines that the inserted battery 201 is still in good condition to be charged (e.g., based on its usage), the system 200 can store the usage analysis result in the battery memory 213 attached to the inserted battery 201 (or upload it to the server 203 or store it in the database 205) for future reference.

In some embodiments, the system 200 can have a maintenance policy which has a threshold value (e.g., time, cycle counts, etc.) for determining whether to take an action. For example, the threshold value period can be 10-50 days. In an event that a time difference between an expected battery maintenance time (e.g., 20 days later) and the time at which the inserted battery 201 is inserted in a battery station is greater than the threshold value, the system 200 will not take an action at this stage. When the time difference is less than the threshold value, the system 200 can implement the generated battery maintenance plan by sending a notice 214 to a user (e.g., a user who is going to exchange a battery at the station 207) to motivate the user to deliver the inserted battery 201 to a location when the user finishes the use of the inserted battery 201 (e.g., the station 207 still charges the inserted battery 201 such that it can be used by the user). In some embodiments, the notice 214 can be visually presented to the user via the display 215.

In some embodiments, if the system 200 determines that it needs to take an immediate action (e.g., the time difference is less than threshold value, or the date for taking action is overdue), the system 200 can send the notice 214 to a service/courier crew, requesting the recipient to pick up the inserted battery 201.

In some embodiments, the threshold value can be a threshold charging cycle count (e.g., how many remaining charging cycles until next maintenance). In some embodiments, the threshold value can vary depending on user behavior. For example, for batteries designed to be used by a high-performance battery user (e.g., a user who drives/rides fast), the threshold value can be lower than a regular threshold value (e.g., need more frequent maintenance).

Figure 2B:
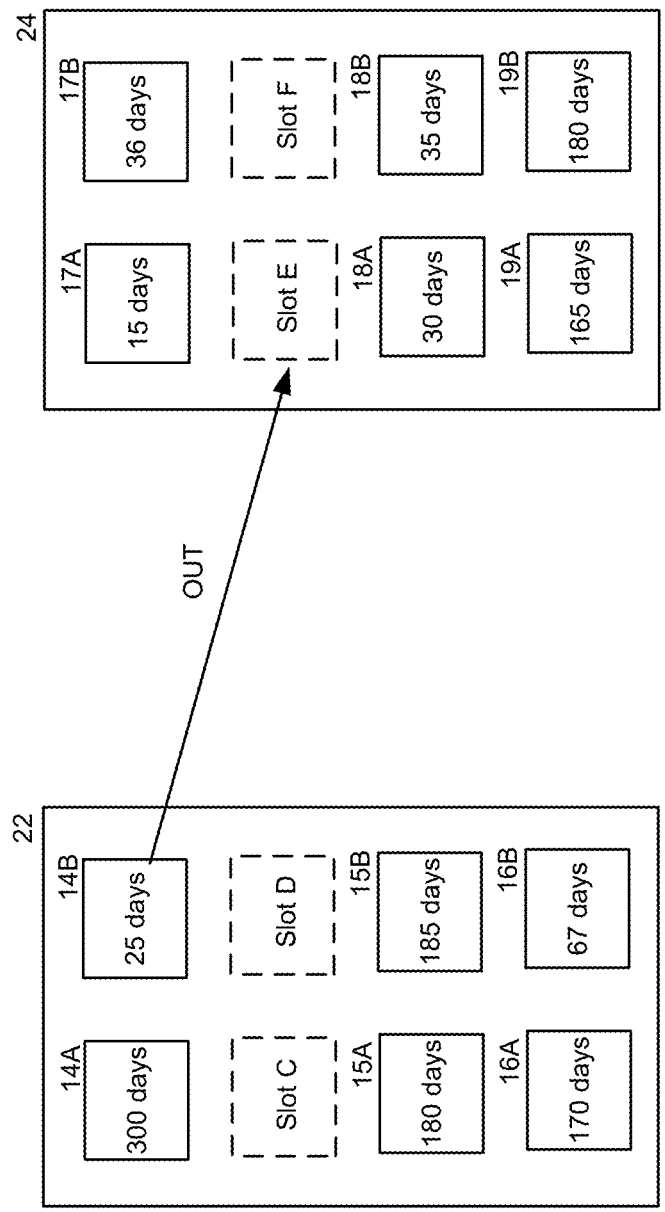
FIG. 2B is a schematic diagram illustrating two battery-exchange station systems in accordance with embodiments of the disclosed technology.

FIG. 2B is a schematic diagram illustrating two battery-exchange station systems 22 and 24 in accordance with embodiments of the disclosed technology. As shown, the station system 22 includes six batteries 14A-B, 15A-B, and 16A-B and two slots C, D. As shown, based on individual battery maintenance plans, the battery 14A needs to be maintained in 300 days, the battery 14B needs to be maintained in 25 days, the battery 15A needs to be maintained in 180 days, the battery 15B needs to be maintained in 185 days, the battery 16A needs to be maintained in 170 days, and the battery 16B needs to be maintained in 67 days. Similarly, the station system 24 includes six batteries 17A-B, 18A-B, and 19A-B and two slots E, F. As shown, the battery 17A needs to be maintained in 15 days, the battery 17B needs to be maintained in 36 days, the battery 18A needs to be maintained in 30 days, the battery 18B needs to be maintained in 35 days, the battery 19A needs to be maintained in 165 days, and the battery 19B needs to be maintained in 180 days.

In the illustrated embodiments, a maintenance policy for systems 22, 24 is to remove batteries that have less-than-40-days to the next maintenance from the systems 22, 24. Also, a service crew is scheduled to pick up batteries eligible for maintenance at the station system 24 at 3 a.m. In this embodiment, the system 22 sends notices to a group of battery users (e.g., those who live close to the system 22, those who have been exchanged batteries at the system 22, those who are currently located close to the system 22, etc.), offering them incentives (e.g., discounts, credits, cash, points, etc.) if they can bring the battery 14B to the station system 24 by 3 a.m. By this arrangement, the service crew does not need to go to every station system to pick up batteries to be maintained or replaced, and accordingly transportation/logistic expenses are reduced. In some embodiments, the users can be motivated by advertisements, activities (e.g., creating a delivery task from the system 22 to the system 24), games (e.g., whoever picks up the battery 14B can enjoy a bragging right among peer users), social events (e.g., holding a user meet-up event at the station system 24), etc.

Figure 3:
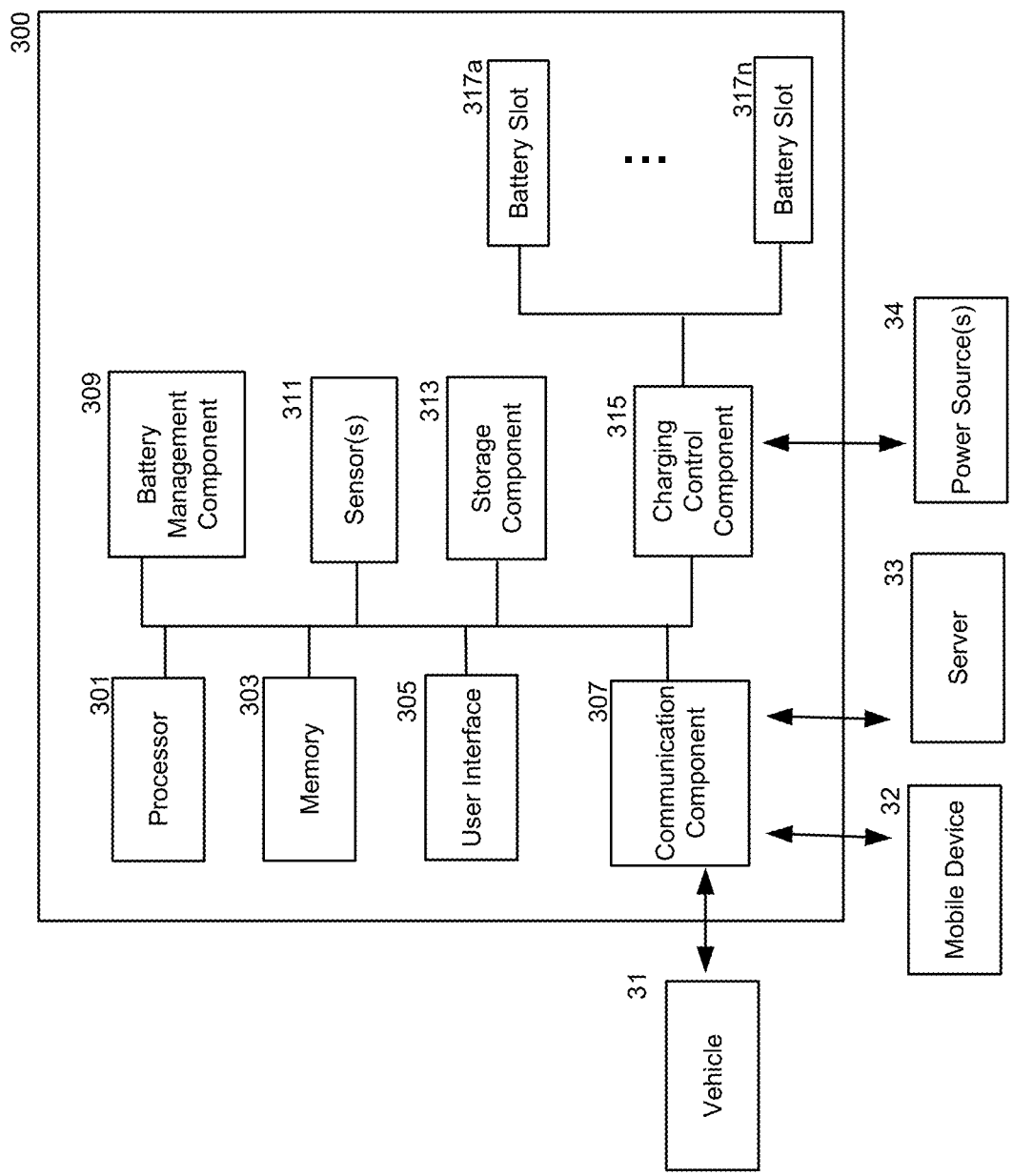
FIG. 3 is a schematic diagram illustrating a station system in accordance with embodiments of the disclosed technology.

FIG. 3 is a schematic diagram illustrating a station system 300 in accordance with embodiments of the disclosed technology. As shown, the station system 300 includes a processor 301, a memory 303, a user interface 305, a communication component 307, a battery management component 309, one or more sensors 311, a storage component 313, and a charging component 315 coupled to multiple battery slots 317a-n. The processor 301 is configured to interact with the memory 303 and other components (e.g., components 305-317) in the station system 300. The memory 303 is coupled to the processor 301 and is configured to store instructions for controlling other components or other information in the station system 300.

The user interface 305 is configured to interact with a user (e.g., receiving a user input and presenting information to the user). In some embodiments, the user interface 305 can be implemented as a touchscreen display. In other embodiments, the user interface 305 can include other suitable user interface devices. The storage component 313 is configured to store, temporarily or permanently, information, data, files, or signals associated with the station system 300 (e.g., information measured by the sensors 313, information collected by the batteries 317a-n, reference information, charging instructions, user information, etc.).

The communication component 307 is configured to communicate with other systems, such as a vehicle 31 (e.g., an electric vehicle that uses the exchangeable battery 201 as its power source), a mobile device 32 (e.g., a battery user's smartphone that has an app configured to manage the vehicle in which the exchangeable battery 201 is used), a server 33 (e.g., the server 103, 203 or the server system 400 to be discussed below with reference to FIG. 4), other station systems, and/or other devices.

The battery management component 309 is configured to collect battery information from various sources and to analyze the collected information. For example, the battery management component 309 can collect information regarding the batteries positioned in the battery slots 317a-n, information regarding the station system 300, information regarding one or more power sources 34, information regarding a user (e.g., received from the mobile device 32 via the communication component 307), and/or information regarding the vehicle 31. In some embodiments, the battery management component 309 can provide all or some of the information to the communication component 307 to transmit or upload the collected information to the server 33 for further analysis or process. After receiving the battery information, the server 33 can analyze the received battery information and compare it to the reference information to generate a customized battery maintenance plan for batteries to achieve predetermined objects (e.g., to maximize battery life, to enhance user's battery experiences, etc.).

In some embodiments, the battery management component 309 can maintain the batteries positioned in the battery slots 317 based on instructions from the server 33 (which can function in the ways similar to the server 103, 303 and the server system 400 to be discussed in detail below with reference to FIG. 4). In some embodiments, the battery management component 309 can periodically communicate with the server 33 to request updated instructions. In some embodiments, the battery management component 309 analyzes the collected battery information associated with a battery that is inserted in one of the battery slots 317 and compares the collected battery information with the reference information.

The charging component 315 is configured to control a charging process for each of the batteries positioned in the battery slots 317a-n (e.g., in accordance with customized maintenance plans generated by the server 33 or the battery management component 309). For example, type B batteries need to be charged based on particular charging rules (e.g., below a threshold charging temperature), so as to maintain an expected battery life span. The battery slots 317a-n are configured to accommodate and charge the batteries positioned and/or locked therein. The charging component 315 receives power from the power sources 34 and then uses the power to charge the batteries positioned in the battery slots 317a-n, based on predetermined customized battery maintenance plans.

In some embodiments, the customized battery maintenance plans can be adjusted based on a battery demand prediction generated by the server 33 (e.g., the battery demand prediction can be generated based on predicted user behavior, station characteristics, events close to a battery-exchange station, etc.). For example, the station system 300 can decide to change a battery maintenance plan in response to a determination that there will not be sufficient power available from the power sources 34 to charge the battery during a period of time.

The sensors 311 are configured to measure information associated with the station system 300 (e.g., working temperature, environmental conditions, power connection, network connection, etc.). The sensors 311 can also be configured to monitor the batteries positioned in the battery slots 317a-n. The measured information can be sent to the battery management component 309 and/or the server 33 for further analysis. In some embodiments, the measured information can be analyzed with the reference information that is used to generate the customized battery maintenance plans. For example, the customized battery maintenance plans can vary depending on the temperature surrounding the station system 300 or the temperatures at the battery slots 317.

Figure 4:
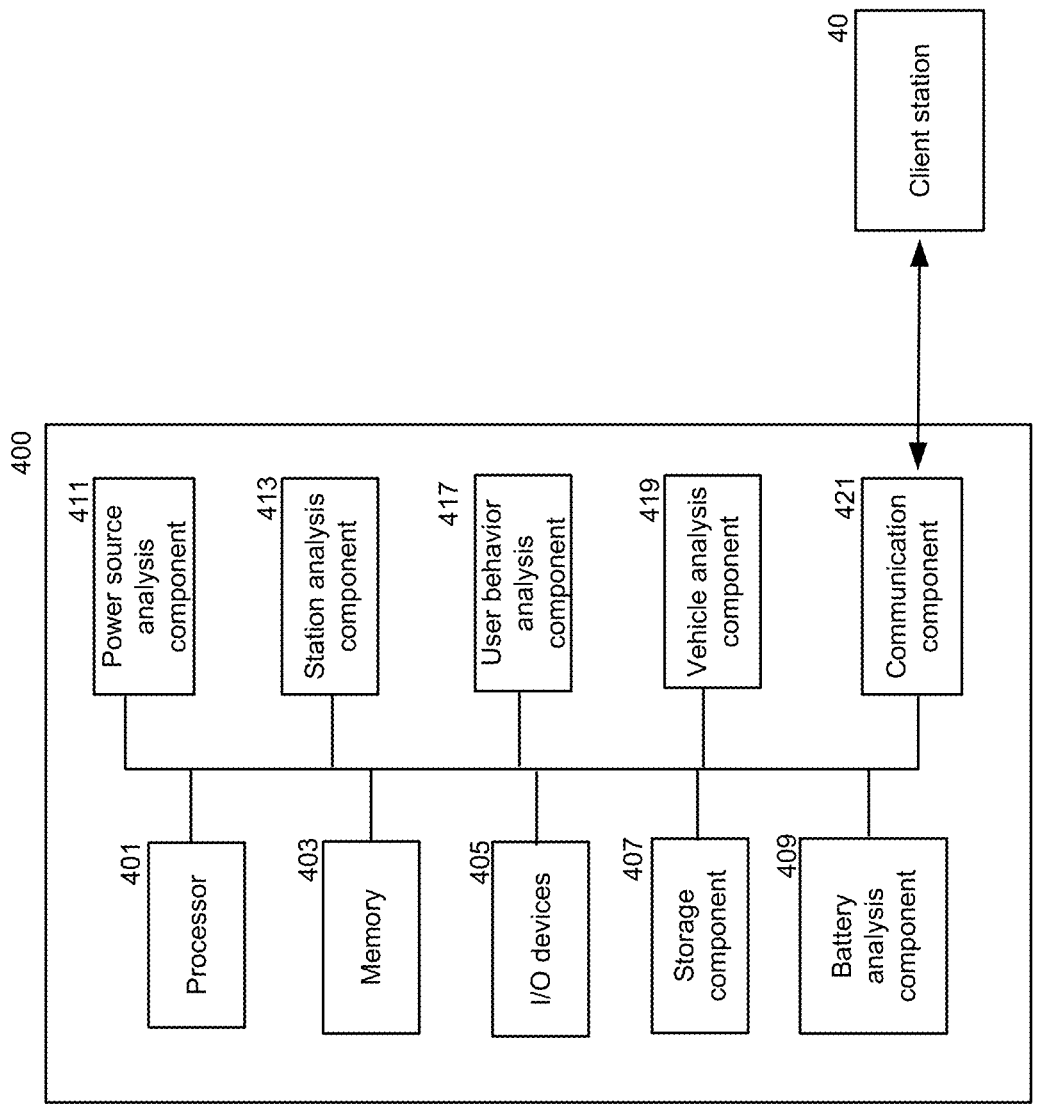
FIG. 4 is a schematic diagram illustrating a server system in accordance with embodiments of the disclosed technology.

FIG. 4 is a schematic diagram illustrating a server system 400 in accordance with embodiments of the disclosed technology. The server system 400 is also configured to collect information associated with multiple batteries that can be deployed or managed by the server system 400. The server system 400 is also configured to analyze the collected information and generate, based on the analysis, a customized battery maintenance plan for a client station 40. In some embodiments, the client station 40 can be implemented as the battery-exchange station 107 or 207 discussed above.

As shown in FIG. 4, the server system 400 includes a processor 401, a memory 403, input/output (I/O) devices 405, a storage component 407, a battery analysis component 409, a power source analysis component 411, a station analysis component 413, a user behavior analysis component 417, a vehicle analysis component 419, and a communication component 421. The processor 401 is configured to interact with the memory 403 and other components (e.g., components 405-421) in the server system 400.

The I/O devices 405 are configured to communicate with an operator (e.g., receive an input therefrom and/or present information thereto). In some embodiments, the I/O devices 405 can be one component (e.g., a touch screen display). In some embodiments, the I/O devices 405 can include an input device (e.g., keyboards, pointing devices, card reader, scanner, camera, etc.) and an output device (e.g., a display, network card, speaker, video card, audio card, printer, or other external device).

The storage component 407 is configured to store, temporarily or permanently, information, data, files, or signals associated with the server system 400 (e.g., collected information, reference information, information to be analyzed, analysis results, etc.). In some embodiments, the storage component 407 can be a hard disk drive, flash memory, or other suitable storage means. The communication component 421 is configured to communicate with other systems (e.g., the client station 40 or other stations) and other devices (e.g., a mobile device carried by a user, a vehicle, etc.).

The battery analysis component 409 is configured to collect and store (e.g., in the storage component 407) battery information to be analyzed. The collected information can be collected from multiple sampling batteries (e.g., FIG. 1B) from various sources (e.g., battery-exchange stations, electric vehicles, batteries, user mobile devices, etc.). After receiving the collected information, the battery analysis component 409 can analyze the collected information.

In some embodiments, the battery analysis component 409 categorizes the collected battery information based on multiple factors such as (1) battery manufacturing, (2) battery basic characteristics, and (3) battery usage. Through analyzing the collected battery information versus the multiple factors mentioned above, the battery analysis component 409 establishes a set of reference information that enables the system to understand how to maintain the battery to achieve an object or goal. The established reference information can be used to generate a battery maintenance plan for batteries in the client station 40. Examples of the battery maintenance plan include (1) how to charge or operate the battery (e.g., under a particular condition such as temperature, current, voltage, etc.); (2) when to replace or maintain the battery; and/or (3) providing firmware updates to the battery based on information provided by the battery's manufacturer.

The power source analysis component 411 is configured to analyze the status (e.g., reliability, stability, continuity, etc.) of one or more power sources that are used to power the client station 40 for charging the batteries therein. For example, the power source analysis component 411 can receive information from a schedule (e.g., an online database maintained by a power company or other source) that a power source used to supply power to the client station 40 will be interrupted during 1 a.m. to 3 a.m. on a particular date. The power source analysis component 411 can implement a battery maintenance plan accordingly (e.g., delay a charging process therein or shift the charging process to an earlier time).

The station analysis component 413 is configured to categorize the multiple battery stations into various types and identify representative characteristics/patterns for each type, such that the battery analysis component 409 can use such information as basis for its analysis. For example, the station analysis component 413 analyzes the collected information and divides the multiple battery stations into various types based on their battery demands. Based on these types, the battery analysis component 409 and the station analysis component 413 can determine a suitable battery maintenance plan. For example, the station analysis component 413 can determine that the station 40 is a high-demand-peak-hour station (e.g., during peak hours, many users go to this station to exchange batteries). After knowing the type of the station 40, the system 400 can implement a battery maintenance plan accordingly (e.g., not to send a service crew to pick up a battery to be replaced during peak hours).

Similar to the station analysis component 413, the user behavior analysis component 417, and the vehicle analysis component 419 are also configured to categorize the user behavior and vehicles powered by the batteries, respectively, into various types and identify representative characteristics/patterns for each type. The user behavior analysis component 417 can categorize the user behavior based on how they exchange and/or use the batteries. For example, a user can be very demanding on battery performance (e.g., a professional racer). As another example, another user may only use battery to power its vehicle for daily errands (e.g., picking up children or grocery shopping). Once a user reserves a battery at the client station 40, the client station 40 then provides information associated with the reservation to the server system 400. The server system 400 can then determine the type/category of the user who made the reservation and accordingly adjust the battery maintenance plan for the client station 40. For example, the server system 400 can learn that the user is a professional racer requesting a particular type of batteries. For example, information read from a battery may contain a temperature reading, indicative of racing (e.g., high discharge rate). In addition, information from a user may indicate a preference to pay for premium batteries (e.g., batteries that provide relatively large discharge current). Together, this information can be used to infer that an exchanged battery has been prematurely aged and the maintenance plan can be adjusted accordingly. The system 400 then instructs the client station 40 to implement a battery maintenance plan for a particular type of batteries at the client station 40, such that one of more of the particular type of batteries (e.g., premium batteries, relatively new batteries, etc.) will be ready for the user to pick up at the client station 40. In some embodiments, such adjustment to the maintenance plan being executed can be made by the client station 40.

The vehicle analysis component 419 can categorize the types of vehicles that users are planning to operate. For each type of vehicles, the vehicle analysis component 419 can determine which types of batteries work best for each type of vehicles. For example, the vehicle analysis component 419 can determine that an electric scooter works best with a specific type of battery. In such embodiments, the vehicle analysis component 419 can work with the battery analysis component 409 to adjust the battery maintenance plan for the specific type of battery (e.g., (1) to charge a battery that would otherwise be removed for maintenance if the system knows that it will be picked up by a user of a particular type of vehicle who has reserved a battery at a particular charging station), if the server system 400 receives related vehicle information. In some embodiments, such information can be found in the user profiles or account information. In other embodiments, such vehicle information can be provided by the client station 40 to the server system 400.

In some embodiments, the present technology can provide multiple types of characteristic curves or patterns that can be used as reference information to determine how to manage (e.g., charge, service, replace, etc.) a particular battery to achieve an object or a goal. In some embodiments, the object or goal can be determined based on financial reasons (e.g., to reduce operation expenses), customer satisfaction (e.g., to provide highest possible battery experience to a user), or other suitable factors.

Figure 5:
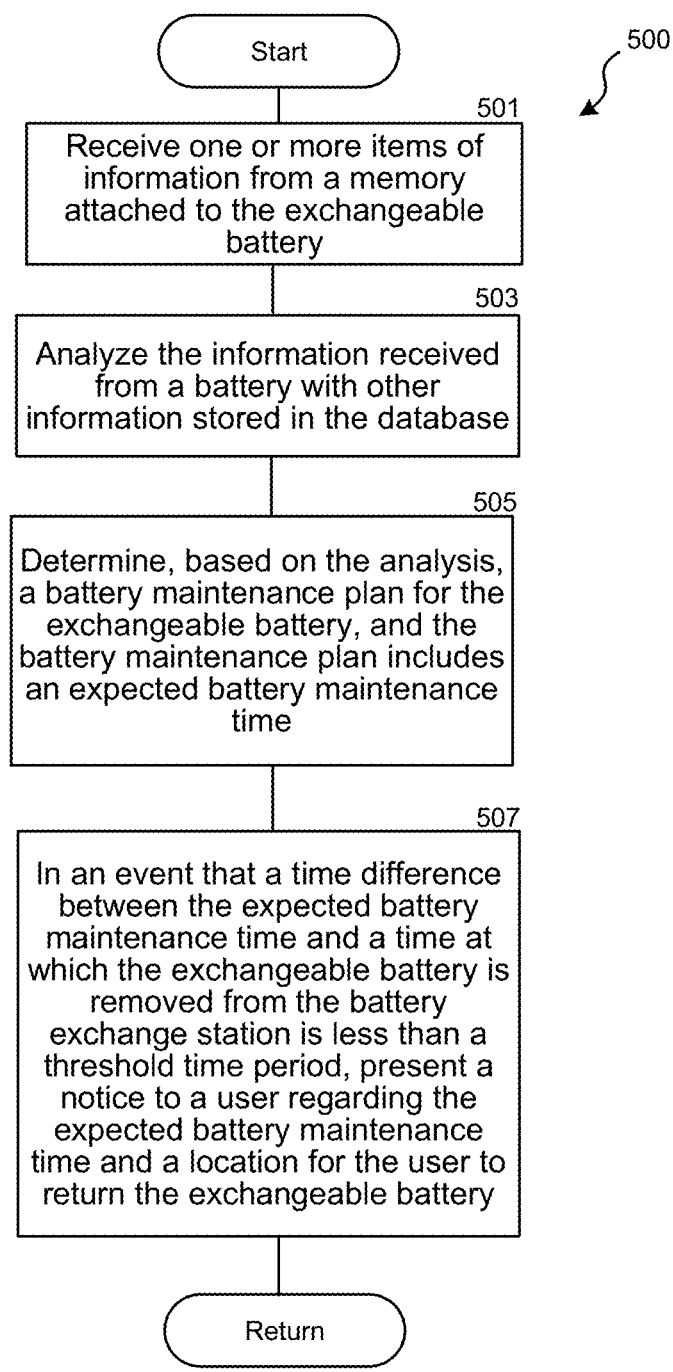
FIG. 5 is a flowchart illustrating a method in accordance with embodiments of the disclosed technology.

FIG. 5 is a flowchart illustrating a method 500 in accordance with embodiments of the disclosed technology. The method 500 is configured to generate a battery maintenance plan for an exchangeable battery. The method 500 is also configured to implement the generated battery maintenance plan. The method 500 can be implemented (1) by a server (e.g., the server system 400 discussed above) with a battery-exchange station (e.g., the station system 300) or (2) by a battery-exchange station alone. The method 500 starts at block 501 by receiving one or more items of battery information from a memory attached to the exchangeable battery. The battery information includes battery manufacturing information, battery characteristic information, battery charging information, and battery usage information. At block 503, the method 500 continues by analyzing the information received from a battery with other information stored in the database to determine what, if any, changes should be made to the battery maintenance plan for the battery.

At block 505, an associated system (e.g., a server or a station) determines, based on the analysis, a battery maintenance plan for the exchangeable battery. The battery maintenance plan may include an expected battery maintenance time. In some embodiments, the information in the database is generated based on information collected from multiple sampling batteries. The sampling batteries and the exchangeable battery have at least one characteristic in common (e.g., the same manufacture, the same specification, etc.), and therefore the present technology can use this characteristic in common to determine which part of the collected information (and also how much weighting should be assigned thereto) is going to be used to determine a battery maintenance plan for the exchangeable battery.

At block 507, the method 500 then presents a notice to a user regarding an expected battery maintenance time and a location for the user to return the exchangeable battery, when a time difference between the expected battery maintenance time and a time at which the exchangeable battery is removed from the battery-exchange station is less than a threshold time period.

Figure 6:
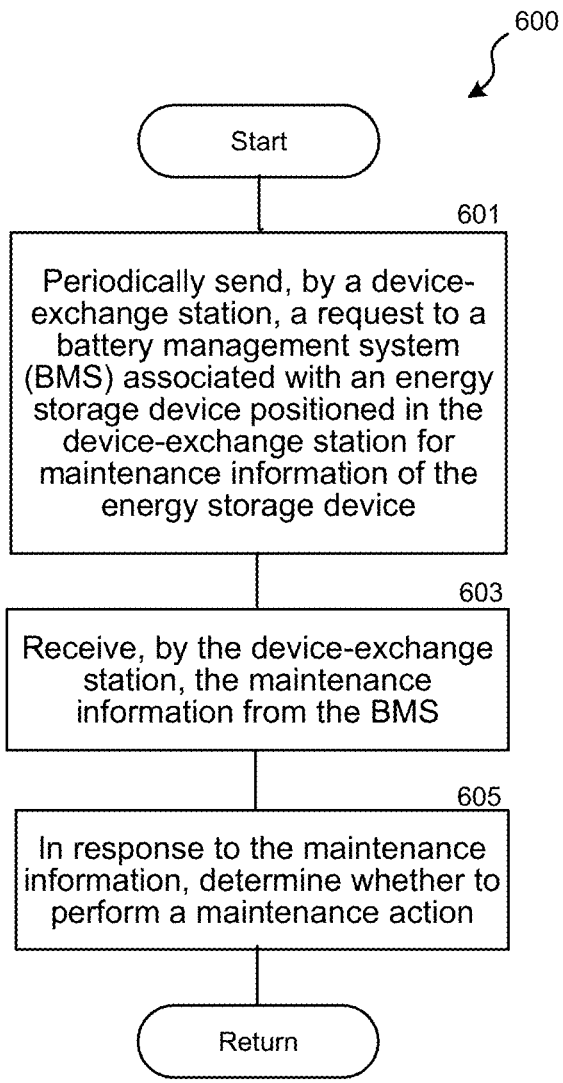
FIG. 6 is a flowchart illustrating a method in accordance with embodiments of the disclosed technology.

FIG. 6 is a flowchart illustrating a method 600 in accordance with embodiments of the disclosed technology. The method 600 is configured to maintain energy storage devices positioned in a device-exchange station. The method 600 can be implemented by a battery-exchange station (e.g., the station system 300). The method 600 starts at block 601 by periodically sending, by a device-exchange station, a request to a battery management system (BMS) associated with an energy storage device positioned in the device-exchange station for maintenance information of the energy storage device. At block 603, the method 600 continues by receiving, by the device-exchange station, the maintenance information from the BMS. At block 605, the method 600 includes in response to the maintenance information, determining whether to perform a maintenance action. In some embodiments, locking the at least one selected energy storage device means making it not "exchangeable." By this arrangement, the disclosed technology can effectively maintain multiple energy storage devices in various device-exchange stations.

Figure 7:
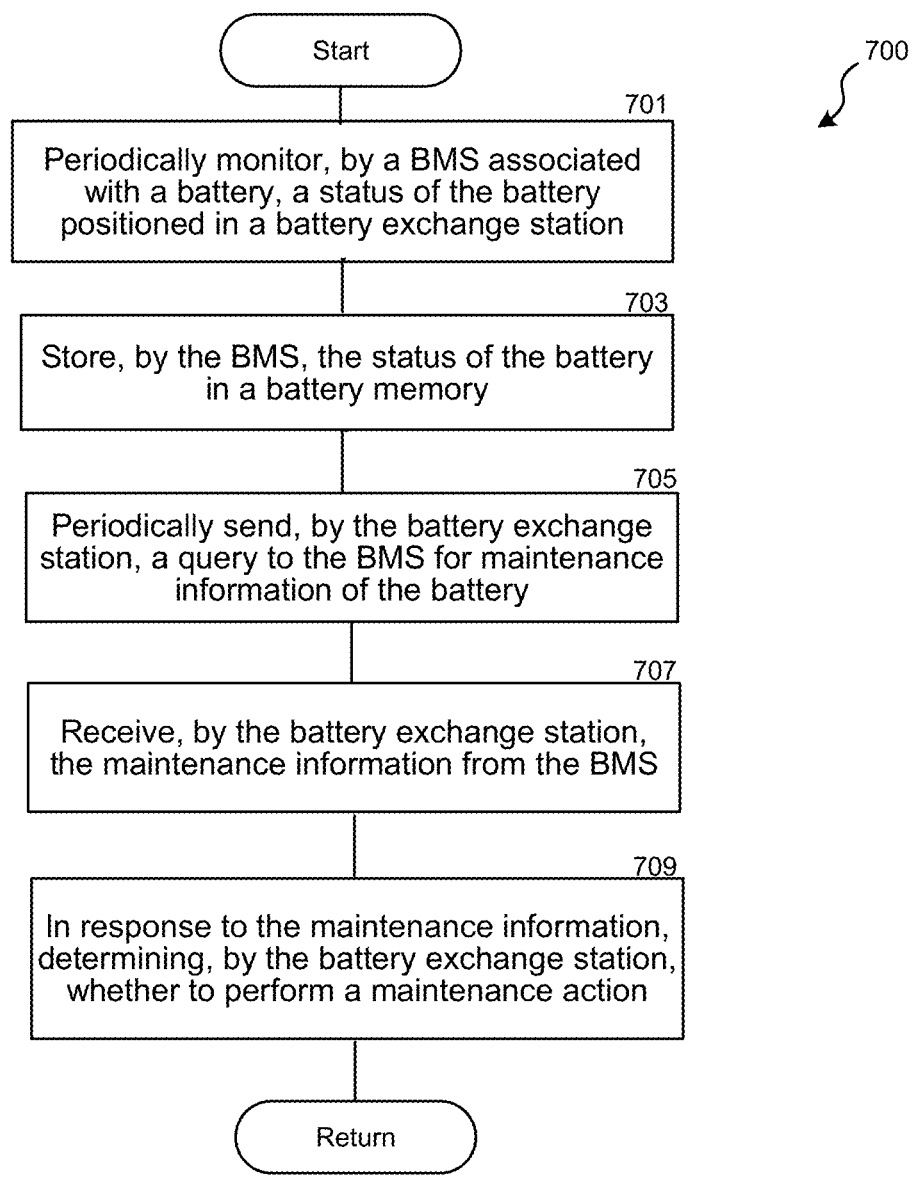
FIG. 7 is a flowchart illustrating a method in accordance with embodiments of the disclosed technology.

FIG. 7 is a flowchart illustrating a method 700 in accordance with embodiments of the disclosed technology. The method 700 is configured to maintain batteries positioned in a battery-exchange station. The method 700 can be implemented by a battery-exchange station (e.g., the station system 300) and a battery management system (e.g., BMS 127 shown in FIG. 1C). The method 700 starts at block 701 by periodically monitoring, by a BMS associated with a battery, a status of the battery positioned in a battery-exchange station. At block 703, the method 700 continues by storing, by the BMS, the status of the battery in a battery memory. At block 705, the method 700 continues by periodically sending, by the battery-exchange station, a query to the BMS for maintenance information of the battery.

At block 707, the method 700 continues by receiving, by the battery-exchange station, the maintenance information from the BMS. At block 709, the method 700 includes, in response to the maintenance information, determining, by the battery-exchange station, whether to perform a maintenance action. In some embodiments, the maintenance action can include (1) terminating a charging process of the battery, (2) decreasing a swapping priority of the battery, and/or (3) locking the battery. In some embodiments, locking the battery means making it not "exchangeable." In some embodiments, the battery can be locked by locking a gate for a slot configured to position the battery or by a mechanical lock. In some embodiments, in response to the monitored status of the battery, the BMS can perform a BMS action, such as (1) locking the battery (e.g., sending a request to the battery-exchange station to lock the battery) and/or (2). terminating a charging process thereof (e.g., operating a physical/logical switch so as to prevent the battery from being charged by the battery-exchange station).

In some embodiments, the maintenance information can include an abnormal message associated with the energy storage device. Examples of the abnormal message can include messaging relating to the following events: battery cell temperature errors (e.g., battery cell temperature is more than 60-80 degrees Celsius when it is in a vehicle; battery cell temperature is more than 90 degrees when it is in a slot of a station), connecting errors, communication errors, power errors (e.g., AC/DC current errors, etc.), device-exchange station errors (e.g., disconnected, accidentally moved, no response, etc.), and/or other suitable events/incidents.

In the embodiments discussed herein, a "component" can include a processor, control logic, a digital signal processor, a computing unit, and/or any other suitable device that is either configured or is programmed to execute instructions to perform the functionality described above.

Although the present technology has been described with reference to specific exemplary embodiments, it will be recognized that the present technology is not limited to the embodiments described but can be practiced with modification and alteration within the spirit and scope of the appended claims. Accordingly, the specification and drawings are to be regarded in an illustrative sense rather than a restrictive sense.

The invention claimed is:

1. A method comprising:
periodically sending, by a device-exchange station, a request to a battery management system (BMS) embedded in an energy storage device positioned in the device-exchange station for maintenance information of the energy storage device;
receiving, by the device-exchange station, the maintenance information from the BMS, wherein the maintenance information includes a usage history of the energy storage device, wherein the BMS is configured to periodically perform a full charge capacity (FCC) calibration process to determine a status of the energy storage device, and wherein a result of the FCC calibration process includes a long-term trend and a short-term trend; and
in response to the maintenance information, determining whether to perform a maintenance action.

2. The method of claim 1, wherein the status of the energy storage device is stored in a battery memory attached to the energy storage device, and wherein the maintenance information includes the status of the energy storage device, and wherein the BMS is configured to send the maintenance information to the device-exchange station, upon receiving the request.

3. The method of claim 2, wherein the BMS is configured to perform a BMS action in response to the status of the energy storage device.

4. The method of claim 3, wherein the BMS action includes locking the energy storage device.

5. The method of claim 3, wherein the BMS action includes terminating a charging process of the energy storage device.

6. The method of claim 2, wherein the BMS is configured to initiate a charging test to determine the status of the energy storage device.

7. The method of claim 1, wherein the maintenance information includes an abnormal message, and wherein the maintenance action includes at least one of terminating a charging process of the energy storage device, decreasing a swapping priority of the energy storage device, and locking the energy storage device.

8. The method of claim 7, wherein locking the energy storage device includes locking a gate for a slot configured to position the energy storage device.

9. The method of claim 7, wherein locking the energy storage device includes locking the energy storage device by a mechanical lock.

10. The method of claim 1, wherein the long-term trend is determined based on an average of FCC changes of the energy storage device during its last ten charging cycles.

11. The method of claim 10, wherein the short-term trend is determined based on an average of FCC changes of the energy storage device during its last two charging cycles.

12. The method of claim 10, wherein the maintenance information indicates that the long-term trend exceeds a long-term upper threshold or the short-term trend exceeds a short-term upper threshold, and wherein the maintenance action includes locking the energy storage device.

13. The method of claim 10, wherein the maintenance information indicates that the long-term trend is in a long-term FCC range or the short-term trend is in a short-term FCC range, and wherein the maintenance action includes determining that the energy storage device is in a watch-list category.

14. The method of claim 10, wherein the maintenance information indicates that the long-term trend is less than a long-term lower threshold and the short-term trend is less than a short-term lower threshold, and wherein the maintenance action includes determining that the energy storage device is in a normal category.

15. The method of claim 1, furthering comprising sending a notice indicative of the maintenance information to a server.

16. The method of claim 1, furthering comprising sending a notice to a service crew to pick up the energy storage device.

17. A station system comprising:
a processor;
a plurality of battery slots coupled to the processor and configured to accommodate a plurality of batteries; and
a battery management component configured to—
periodically send a request to a battery management system (BMS) embedded in a battery positioned in one of the plurality of battery slots for maintenance information of the battery, wherein the maintenance information includes a usage history of the battery;

receive the maintenance information from the BMS, wherein the BMS is configured to periodically perform a full charge capacity (FCC) calibration process to determine a status of the energy storage device, and wherein a result of the FCC calibration process includes a long-term trend and a short-term trend; and in response to the maintenance information, determine whether to perform a maintenance action.

18. The station system of claim 17, wherein the status of the battery is stored in a battery memory attached to the battery, and wherein the maintenance information includes the status of the battery, and wherein the BMS is configured to send the maintenance information to the station system upon receiving the request.

19. The station system of claim 18, wherein the BMS is configured to perform a BMS action in response to the status of the battery.

20. The station system of claim 19, wherein the maintenance action includes at least one of terminating a charging process of the battery, decreasing a swapping priority of the battery, and locking the battery, and wherein the BMS action includes at least one of locking the battery and terminating a charging process of the battery.

\* \* \* \* \*